US006940384B2

United States Patent
Hooey et al.

(10) Patent No.: US 6,940,384 B2
(45) Date of Patent: Sep. 6, 2005

(54) PACKAGING TECHNIQUES FOR A HIGH-DENSITY POWER CONVERTER

(75) Inventors: Roger Hooey, Rockwall, TX (US); Drue Nicholson, Rockwall, TX (US)

(73) Assignee: NetPower Technologies, Inc., Plano, TX (US)

( * ) Notice: Subject to any disclaimer, the term of this patent is extended or adjusted under 35 U.S.C. 154(b) by 73 days.

(21) Appl. No.: 10/383,476

(22) Filed: Mar. 7, 2003

(65) Prior Publication Data

US 2003/0174037 A1 Sep. 18, 2003

Related U.S. Application Data

(60) Provisional application No. 60/363,680, filed on Mar. 11, 2002.

(51) Int. Cl.$^7$ ................................... H01F 5/00
(52) U.S. Cl. .................... 336/200; 336/210; 361/760
(58) Field of Search .................. 336/83, 200, 210, 336/232; 361/760–764

(56) References Cited

U.S. PATENT DOCUMENTS 5,321,380 A * 6/1994 Godek et al. ............... 336/232
5,754,088 A * 5/1998 Fletcher et al. ............. 336/200
6,373,736 B2 * 4/2002 Matsumoto et al. ........ 363/147
6,513,230 B2 * 2/2003 Inoue et al. ................. 29/606
6,813,163 B2 * 11/2004 Inoue et al. ................. 361/784

* cited by examiner

Primary Examiner—Tuyen T Nguyen
(74) Attorney, Agent, or Firm—Enrique J. Mora; Beusse, Brownlee, Wolter, Mora & Maire, P.A.

(57) ABSTRACT

A high-density power converter that benefits from improved packaging techniques and thermal handling capability is provided. The power converter includes a magnetic core. The converter further includes a printed circuit board providing at least one cutout for receiving a portion of the magnetic core. A circuit is magnetically coupled to the magnetic core. A stopper is configured at an edge of the cutout proximate to the circuit to hold the magnetic core at a predefined distance relative to the circuit, thereby meeting a safety distance requirement between the core and the circuit. Advanced thermal management is provided by way of a heatsink assembly to enhance the thermal-handling capability of the converter.

8 Claims, 3 Drawing Sheets

PACKAGING TECHNIQUES FOR A HIGH-DENSITY POWER CONVERTER

This application claims priority to a provisional application filed on Mar. 11, 2002, having application No. 60/363,680, which is incorporated herein by reference.

BACKGROUND OF THE INVENTION

This invention is generally related to power converters, and, more particularly, to packaging techniques and heatsink assemblies for improving the thermal performance of a high-density power converter and thereby increase the power density of the converter.

Power converter devices, such as dc/dc power converters, are widely used in numerous applications, e.g., telecommunication and networking applications. A dc/dc converter converts a raw dc voltage (input), usually with a certain variation range, to a dc voltage (output) that meets a given set of specifications.

The most widely used modules are generally provided in certain standard sizes, such as so-called quarter brick, half brick, and full brick. With fast-growing technologies used in the telecommunications equipment, the demands on the output current of the power converters keep increasing so that higher power output can be obtained for a given module size. Thus, increasing the power density of the converter at an affordable cost is a desirable goal of suppliers of power converters, such as the assignee of the present invention. As more components are added to an electronics module to increase its power rating, appropriate distances between circuits positioned at opposite sides of an isolation boundary should be kept to meet safety requirements from agencies such as Underwriters Laboratories. As the actual limit of the usable power of a given module is generally dictated by the thermal-handling capability of its components, thermal management also becomes an important consideration for obtaining optimum performance of power converters.

Traditionally, power modules may be designed using a so-called two-board approach: most heat-generating components are disposed on one metal board, while other components are put on a printed circuit board (PCB), for example, comprising FR4 dielectric, or other suitable material. To reduce the complexity and costs associated with two-board manufacturing operations, a single-board design approach is also used wherein every electrical component, including heat-generating components, are located on a single PCB. Power magnetic circuits, such as power transformers and inductors can also be integrated onto the single PCB. This integration of multiple components on a single PCB presents several challenges to the designer:

One must ensure that safety distances, e.g., creepage and/or clearance distances, are appropriately met for the traces and circuit components on the PCB, as required by safety agencies such as the Underwriters Laboratories Inc. (UL).

One must ensure, through appropriate thermal management of the key power generating components, that the usable power delivered by the converter actually meets its rated specifications.

U.S. Pat. No. 5,990,776, titled "Low Noise Full Integrated Multilayers Magnetic For Power Converters" purports to embed all transformer/inductor windings inside the PCB by not putting any of the transformer/inductor windings on the outside layers of the PCB. Conceptually, safety clearance/creepage requirements should be somewhat reduced and more space should result for mounting other electrical components. Unfortunately, under this approach, it is believed that heat generated by the transformer and/or inductor windings is also trapped inside the PCB, and this may lead to strained thermal performance.

BRIEF SUMMARY OF THE INVENTION

The inventors of the present invention have recognized innovative packaging techniques that allow the heat generated by the components of a power converter, as may be mounted on a PCB, to be more readily transferred to the surrounding environment. It is also desirable to provide packaging techniques conducive to reliably meeting the safety distance requirements for the traces and components on the PCB while optimizing board space.

Generally, the present invention fulfills the foregoing needs by providing in one aspect thereof, a power converter comprising a magnetic core. The converter further comprises a printed circuit board including at least one cutout for receiving a portion of the magnetic core. A circuit, such as a primary circuit and a secondary circuit, is magnetically coupled to the magnetic core. A stopper is configured at an edge of the cutout to hold the magnetic core at a predefined distance relative to the circuit, thereby meeting a safety distance requirement between the core and the primary or the secondary circuit.

In another aspect thereof, the present invention further fulfills the foregoing needs by providing a thermally efficient baseplate design to enhance the thermal capability of a power converter. The baseplate is configured so that an interfacing surface of the baseplate generally follows the profile of the heat-generating components on the printed circuit board, so that heat can be more efficiently removed from the heat-generator components and transferred to the surrounding environment. An integrated assembly, such as may integrate a baseplate together with a heatsink, may also be provided to further improve the thermal transfer ability of the power converter when such capability is needed.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
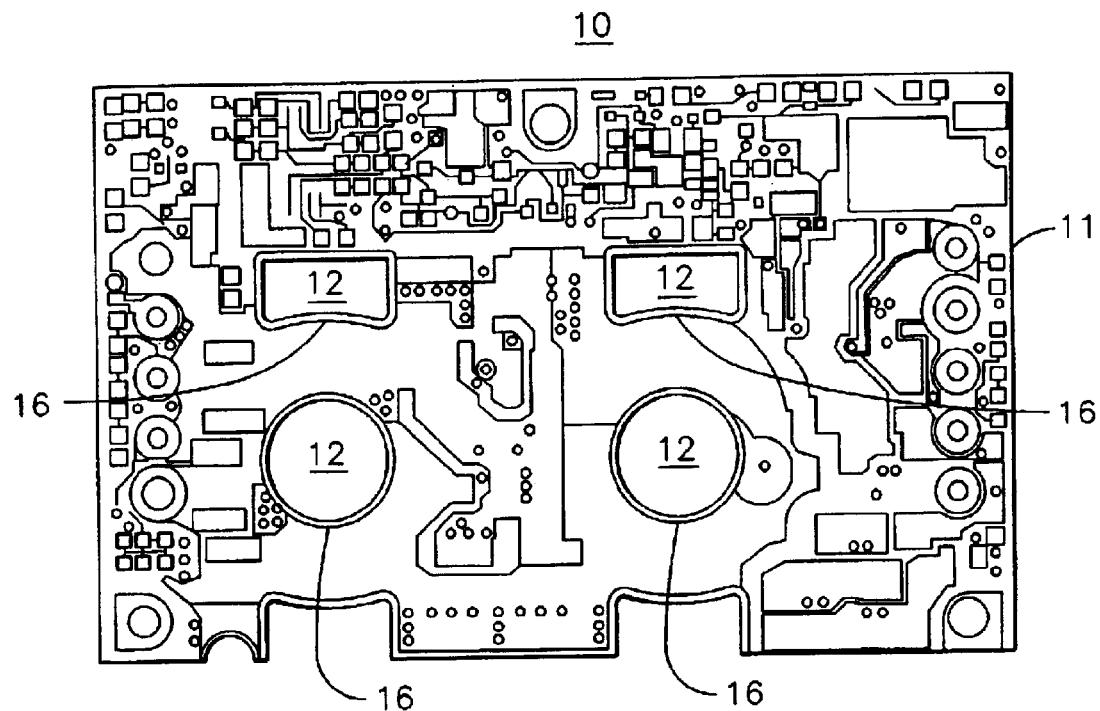
FIG. 1 illustrates a top view of a printed circuit board (PCB) including one or more cutouts configured to receive a portion of a magnetic core of a power transformer or inductor.

FIG. 1 illustrates an exemplary power converter 10 comprising a printed circuit board (PCB) 11 including one or more cutouts 12 configured to receive a portion of a magnetic core 14 (FIGS. 2 and 3) of a power transformer or inductor. The inventors of the present invention in one aspect thereof propose to configure an outside layer of the PCB, e.g., a metallized layer 16, as the power winding of the power transformer/inductor so that the heat generated by the windings can be more readily transferred to the surrounding environment.

In the event a transformer core is considered, since the power transformer comprises primary and secondary circuits, appropriate electrical isolation is required between each of these circuits as well as between the magnetic core relative to each of the circuits. In a practical implementation, the transformer core can be configured to be part of either the primary circuit or the secondary circuit, depending on the outside layer winding configuration or the designer's choice. In the following description, the core will be treated as part of the secondary circuit. That is, the core and the secondary circuit may be jointly positioned at a different or opposite side of an isolation boundary relative to the side where the primary circuit is positioned. It will be appreciated, however, that the core could be made part of the primary circuit in lieu of the secondary circuit.

Figure 2:
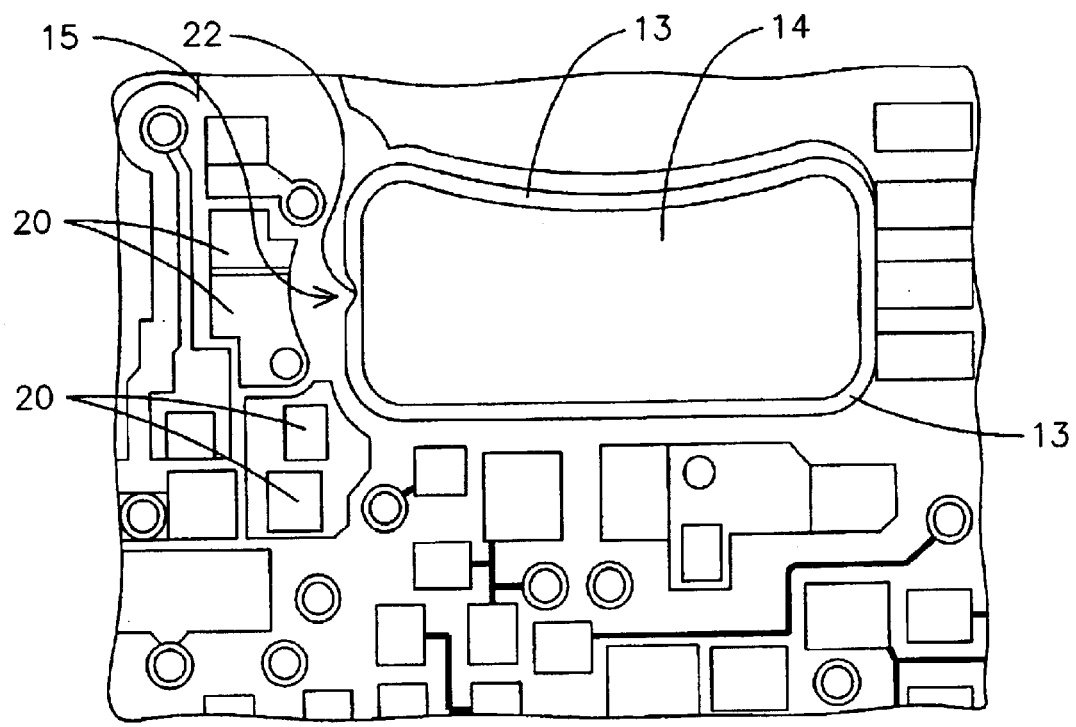
FIGS. 2 and 3 respectively illustrate exemplary embodiments of structural features, such as a stopper, conducive to meeting the safety distance requirements between electrical components on the printed circuit board while optimizing board space.
Figure 3:
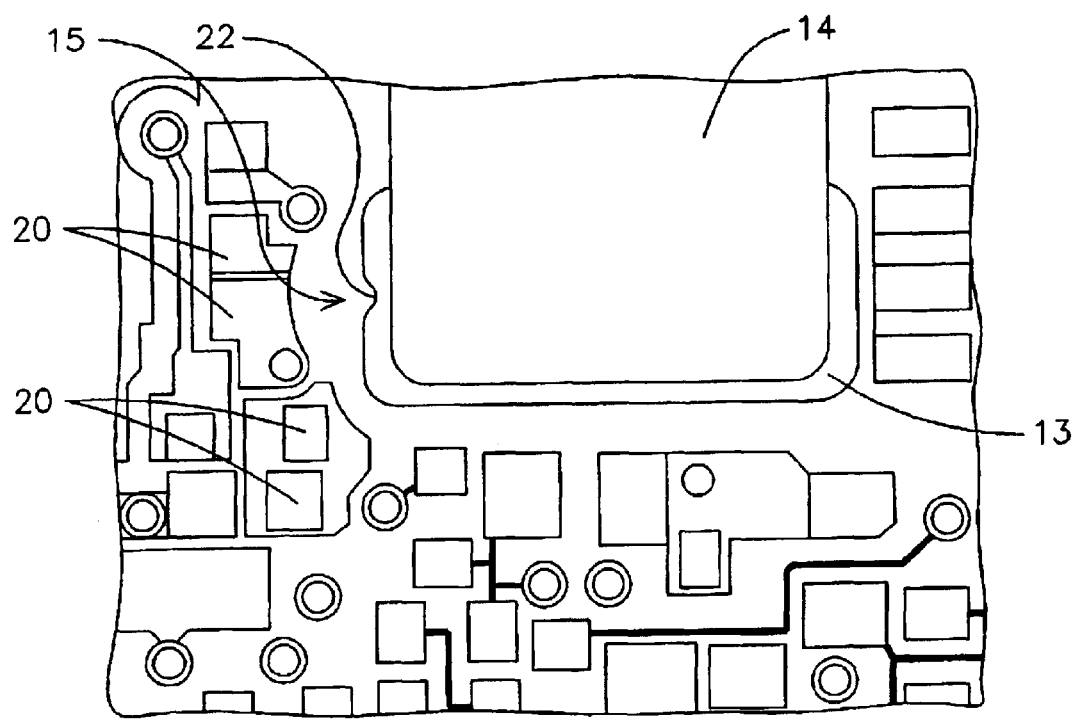

The required safety creepage and clearance distances have to be appropriately met particularly between the magnetic core and the primary circuit that is magnetically coupled to the core. That is, between the core and the components and/or traces that collectively make up the primary circuit. By way of example, some of the components that make up the primary circuit are represented in FIGS. 2 and 3, by reference numeral 20. As will be appreciated by those skilled in the art, creepage refers to the shortest path between two conductive components measured along the surface of the insulation. Clearance refers to the shortest distance between two conductive components measured through air and along the surface of the insulation.

Because a respective portion of the magnetic core, such as a leg of the magnetic core, is mounted through each respective cutout 12, the core, if not appropriately restrained, could shift to any location the cutout allows, including the edge of the cutout proximate to the primary circuit, e.g., cutout edge 15. Therefore, aspects of the present invention innovatively provide structure for maintaining the core sufficiently apart relative to the primary circuit. An appropriate air gap 13 is generally desired between the core and the edges of the cutout to enhance the isolation between the core and the primary circuit.

FIGS. 2 and 3 respectively show exemplary structural features conducive to meeting the safety distance requirements while optimizing board space. More particularly, a stopper 22 is provided to keep magnetic core 14 spaced apart relative to cutout edge 15. That is, the edge of the cutout proximate to the primary circuit. Stopper 22 may be made up of non-conductive material or may be part of PCB 11 provided conductive material has been removed from the outer layers of the PCB that define the stopper. That is, the stopper can be directly integrated with the PCB to reduce costs, as compared to a separate stopper piece.

In one exemplary embodiment, the stopper may be shaped so that the air gap defined by the stopper (e.g., the distance encompassed by the tip of the stopper relative to cutout edge 15 outside the area where the stopper is located) between the core and the edge of the cutout proximate to the primary circuit is sufficiently spaced apart (such as equal or higher than 1/3 of the required safety clearance distance) so that the core is just required to meet the appropriate clearance distance relative to the primary circuit. Generally, the clearance distance is much smaller than the creepage distance. Consequently, use of the stopper advantageously reduces the size of the required safety distance between the core and the primary circuit and, in turn, this reduction of safety distance allows for more area to become available on the PCB. Any savings in PCB area provides design flexibility to the designer for optimizing the overall performance of the power converter. In the event any portion of the primary circuit 20 (e.g., components and/or traces) is located relatively close to the stopper, the root section of the stopper can be optionally drilled out to create sufficient air gap so that just the clearance distance is required between the core and the primary circuit in that region. In one exemplary embodiment, such a drilling would be implemented to provide an appropriately dimensioned opening in the PCB layout.

For many high-temperature applications where airflow is low, a heatsink is usually required to help transfer heat from the power converter to the surrounding environment. Examples of heat-generating or power-generating components may comprise the magnetic cores, power semiconductors, traces that may carry high levels of current, and including the power transformer and inductor windings. Generally, a single-board design may not allow a heatsink to be directly attached to the module, and, thus, an interface plate is typically used for heat transfer and mounting purposes. A conventional interface plate, however, may not provide sufficient thermal relief due to the uneven profile or contour of the heat-generating module/s.

Figure 4:
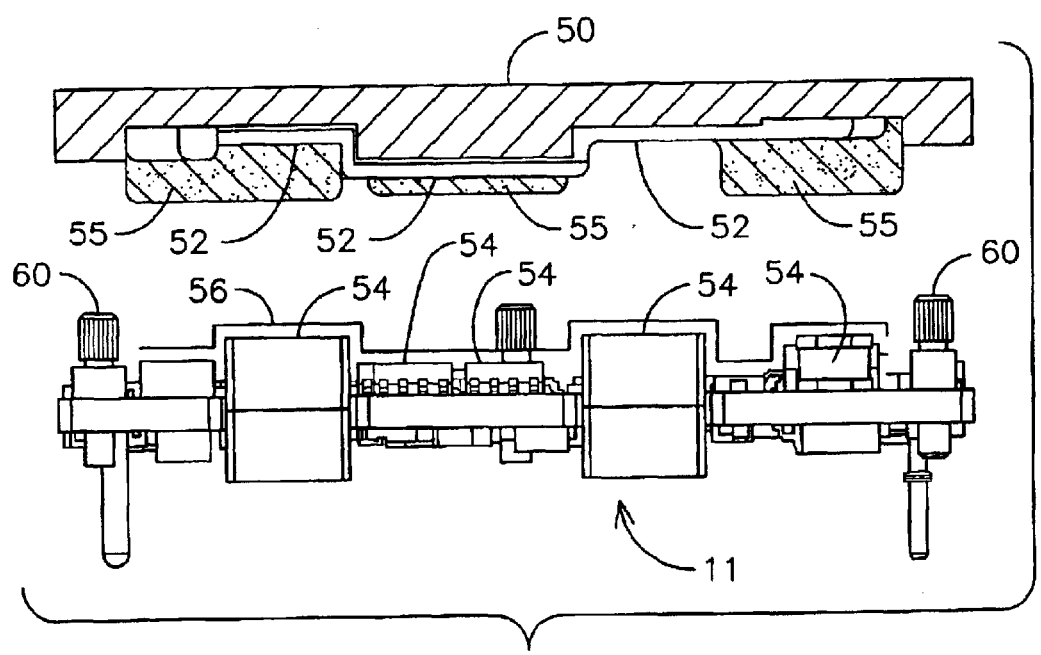
FIG. 4 shows a cross-sectional view of an exemplary baseplate configured to more efficiently thermally couple a heatsink to one or more heat-generating components of the power converter.

FIG. 4 shows a cross-sectional view of an exemplary baseplate 50 (also referred to in the art as interface plate) that allows one to thermally couple a heatsink (not shown in FIG. 4) to one or more heat-generating components 54 mounted on one side of the PCB in an optimum way. In particular, the baseplate surface that engages the heat-generating components 54, e.g., the bottom surface 52 of the baseplate, is configured so that it generally follows the profile or contour of the module/s. Line 56 represents an exemplary profile or contour such as may result from different heights of the various power-generating components 54. Thermal interface material 55, such as epoxy having relatively high thermal conductivity, may be placed between the baseplate (e.g., bottom surface 52 and side walls of the baseplate) and the heat-generating components 54 on the PCB.

In one exemplary embodiment, the thermal interface material can be molded onto the baseplate to ease the manufacturing process. As will be now appreciated by those skilled in the art, the superior thermal coupling achieved by the variable contour established between the baseplate and the heat-producing components enables the heat generated by those components to be more efficiently transferred out to the surrounding environment.

Figure 5:
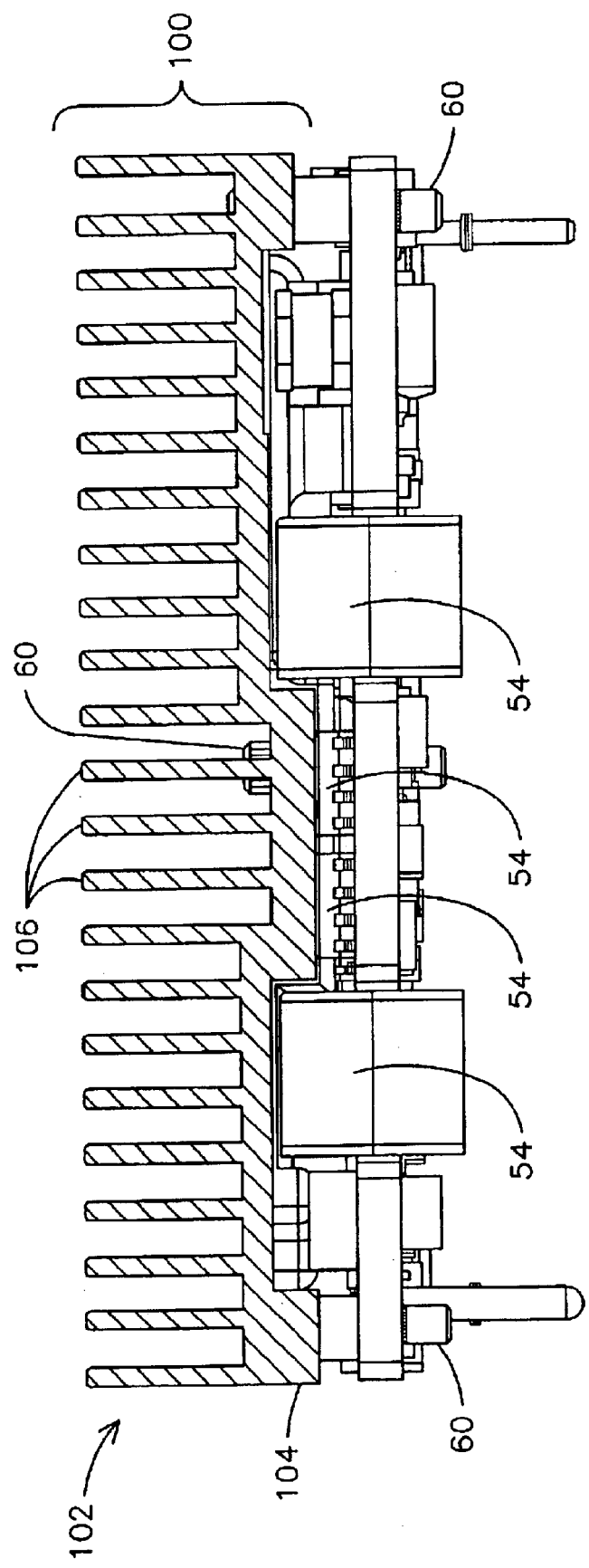
FIG. 5 shows an exemplary embodiment of a heat-dissipating assembly that integrates a heatsink with a respective baseplate.

For applications where the height allowable for the power modules on the PCB and the heatsink is somewhat limited, a solution recognized by the present invention is to integrate the heatsink with the baseplate. FIG. 5 shows an exemplary embodiment of a heat-dissipating assembly 100 that integrates a heatsink 102 with a respective baseplate 104. Some of the fins, e.g., fins 106, are configured to extend relatively deep so that their respective roots are situated respectively closer to the heat-generating components. It is believed that the superior thermal coupling provided by a baseplate having a varying contour relative to the heat-generating components by itself, or in combination with the longer fin length, can substantially improve the overall thermal transfer capability of the heatsink and thereby improve the thermal-handling capability of the power converter.

One or more studs 60 on the baseplate, or the heatsink, can be used to mechanically connect the baseplate to the PCB through various affixing techniques, such as soldering or press-fit insertion. It will be appreciated that the studs can also be used for providing appropriate electrical connections, such as electrical grounding, to the baseplate or the heatsink. The studs can be integrally constructed with the baseplate or the heatsink, or may be provided as separate parts connected to the baseplate through press-fit, soldering or other techniques. By way of example, the heatsink and the baseplate may be manufactured by protrusion, casting, machining or stamping.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A power converter comprising:
   a magnetic core;
   a printed circuit board comprising at least one cutout for receiving a portion of the magnetic core;
   a circuit magnetically coupled to the magnetic core, the circuit positioned on an opposite side of an isolation boundary relative to the magnetic core; and
   a stopper configured at an edge of the cutout proximate to the circuit to hold the magnetic core at a predefined distance relative to the circuit, wherein the stopper comprises a protrusion configured to maintain an air gap between the core and the edge of the cutout proximate to the circuit, said air gap being sufficiently spaced apart so that the core is just required to meet a respective clearance distance relative to the circuit, said air gap being sufficient for reducing a spacing requirement in the isolation boundary between the core and the primary circuit and thereby enabling an incremental area to become available on the printed circuit board.

2. The power converter of claim 1 wherein the air gap defined by the stopper comprises at least about ⅓ of the respective clearance distance.

3. The power converter of claim 1 wherein the stopper is integrally constructed with the printed circuit board on the cutout edge proximate to the circuit.

4. The power converter of claim 1 wherein the circuit is selected from the group consisting of a primary circuit and a secondary circuit.

5. A printed circuit board for a power converter, the printed circuit board comprising:
   a magnetic core including a portion thereof mounted through a cutout in the printed circuit board;
   a circuit magnetically coupled to the magnetic core, the circuit positioned on an opposite side of an isolation boundary relative to the magnetic core; and
   a stopper configured at an edge of the cutout proximate to the circuit to hold the magnetic core at a predefined distance relative to the circuit, wherein the stopper comprises a protrusion configured to maintain an air gap between the core and the edge of the cutout proximate to the circuit, said air gap being sufficiently spaced apart so that the core is just required to meet a respective clearance distance relative to the circuit, said air gap being sufficient for reducing a spacing requirement in the isolation boundary between the core and the primary circuit and thereby enabling an incremental area to become available on the printed circuit board.

6. The printed circuit board of claim 5 wherein the air gap defined by the stopper comprises at least about ⅓ of the respective clearance distance.

7. The printed circuit board of claim 5 wherein the stopper is integrally constructed with the printed circuit board on the cutout edge proximate to the circuit.

8. The printed circuit of claim 5 wherein the circuit is selected from the group consisting of a primary circuit and a secondary circuit.

* * * * *